US012805376B2

(12) United States Patent
Zhou

(10) Patent No.: US 12,805,376 B2
(45) Date of Patent: Nov. 17, 2026

(54) SEMICONDUCTOR PACKAGE AND METHOD OF MANUFACTURING THE SAME

(71) Applicant: Samsung Electronics Co., Ltd., Suwon-si (KR)

(72) Inventor: Weizhong Zhou, Suzhou (CN)

(73) Assignee: Samsung Electronics Co., Ltd., Suwon-si (KR)

(*) Notice: Subject to any disclaimer, the term of this patent is extended or adjusted under 35 U.S.C. 154(b) by 218 days.

(21) Appl. No.: 18/754,897

(22) Filed: Jun. 26, 2024

(65) Prior Publication Data

US 2025/0029882 A1 Jan. 23, 2025

(30) Foreign Application Priority Data

Jul. 17, 2023 (CN) ......................... 202310875558.3

(51) Int. Cl.
*H01L 23/31* (2006.01)
*H01L 21/56* (2006.01)
(Continued)

(52) U.S. Cl.
CPC ........ *H10W 74/117* (2026.01); *H10W 20/056* (2026.01); *H10W 70/68* (2026.01); *H10W 74/01* (2026.01); *H10W 72/07221* (2026.01); *H10W 74/10* (2026.01); *H10W 90/724* (2026.01); *H10W 90/794* (2026.01)

(58) Field of Classification Search
CPC ... H10W 74/117; H10W 74/01; H10W 74/10; H10W 70/68; H10W 20/056; H10W 90/794; H10W 90/724; H10W 72/07221
See application file for complete search history.

(56) References Cited

U.S. PATENT DOCUMENTS

| | | | | |
|---|---|---|---|---|
| 6,489,669 B2 * | 12/2002 | Shimada ............... | H10W 42/20 257/E23.114 |
| 7,217,993 B2 * | 5/2007 | Nishimura ............ | H10W 90/00 438/109 |

(Continued)

FOREIGN PATENT DOCUMENTS

| | | | |
|---|---|---|---|
| CN | 105957845 A | 9/2016 |
| CN | 110444539 A | 11/2019 |
| CN | 111816641 A | 10/2020 |

*Primary Examiner* — Peniel M Gumedzoe
(74) *Attorney, Agent, or Firm* — FISH & RICHARDSON P.C.

(57) ABSTRACT

A semiconductor package and a method of manufacturing the same are provided. The semiconductor package includes a substrate including first and second surfaces opposite to each other and a groove recessed from the first surface, a chip within the groove and including an active surface facing a bottom surface of the groove, an inactive surface opposite to the active surface, and a side surface connecting the active surface with the inactive surface, chip pads on the active surface of the chip, a shielding layer including a first sub-shielding layer between the bottom surface of the groove and the active surface of the chip and including openings corresponding to the chip pads, respectively, a third sub-shielding layer on the inactive surface of the chip, and a second sub-shielding layer between the side surface of the chip and a side surface of the groove and connecting the first and third sub-shielding layers.

18 Claims, 15 Drawing Sheets

100

130: 131, 132, 133
150: 151, 152

(51) Int. Cl.

| | |
|---|---|
| ***H01L 21/768*** | (2006.01) |
| ***H01L 23/00*** | (2006.01) |
| ***H01L 23/13*** | (2006.01) |
| ***H10W 20/00*** | (2026.01) |
| ***H10W 70/68*** | (2026.01) |
| ***H10W 74/01*** | (2026.01) |
| ***H10W 74/10*** | (2026.01) |
| *H10W 72/00* | (2026.01) |
| *H10W 90/00* | (2026.01) |

(56) References Cited

U.S. PATENT DOCUMENTS

| | | | | |
|---|---|---|---|---|
| 8,324,028 | B2 | 12/2012 | Kissing et al. | |
| 8,531,012 | B2 * | 9/2013 | Lee | H10W 20/023<br>438/109 |
| 9,030,841 | B2 | 5/2015 | Arnold et al. | |
| 10,163,744 | B2 * | 12/2018 | Kim | H10W 40/10 |
| 10,504,855 | B2 | 12/2019 | Jung et al. | |
| 10,553,542 | B2 | 2/2020 | Shin et al. | |
| 10,763,220 | B2 | 9/2020 | Dias et al. | |
| 11,342,278 | B2 | 5/2022 | Cho et al. | |
| 2012/0228749 | A1 * | 9/2012 | Pagaila | H10W 20/01<br>257/659 |
| 2019/0098802 | A1 * | 3/2019 | Mokler | H05K 3/341 |
| 2019/0318984 | A1 * | 10/2019 | Kim | H05K 1/0216 |
| 2022/0068832 | A1 | 3/2022 | Yang et al. | |

* cited by examiner

SEMICONDUCTOR PACKAGE AND METHOD OF MANUFACTURING THE SAME

CROSS-REFERENCE TO RELATED APPLICATIONS

This application claims priority under 35 U.S.C. § 119 to Chinese Patent Application No. 202310875558.3, filed on Jul. 17, 2023, in the State Intellectual Property Office of the P.R.C., the disclosure of which is incorporated herein in its entirety by reference.

BACKGROUND

Technical Field

The present disclosure relates to semiconductor packages and/or methods of manufacturing the same, and more particularly, relates to semiconductor packages having an electromagnetic shielding function and/or methods of manufacturing the same.

Description of the Related Art

In highly integrated semiconductor packages, there may be relatively large electromagnetic signal interference between devices. A conventional solution is to provide shielding cases (or covers) outside the devices, but this will lead to an increase in volume and cost of the semiconductor packages, and it is contrary to the trend of miniaturization of the semiconductor packages. Therefore, this method is greatly limited in practical use.

The above information disclosed in this Background section is only for enhancement of understanding of the background of the inventive concepts, and therefore the above information may contain information that does not form prior art already known in the country to those skilled in the art.

SUMMARY

Some example embodiments provide semiconductor packages having an improved electromagnetic shielding effect and/or methods of manufacturing the same.

Some example embodiments provide semiconductor packages having improved reliability and/or methods of manufacturing the same.

Some example embodiments provide a semiconductor package, which may be manufactured by a simplified manufacturing process, and/or methods of manufacturing the same.

A semiconductor package according to an example embodiment may include a substrate including a first surface and a second surface opposite to the first surface, the substrate having a groove recessed from the first surface, a chip within the groove and including an active surface facing a bottom surface of the groove, an inactive surface opposite to the active surface, and a side surface connecting the active surface with the inactive surface, a plurality of chip pads on the active surface of the chip, and a shielding layer including a first sub-shielding layer, a second sub-shielding layer, and a third sub-shielding layer, the first sub-shielding layer between the bottom surface of the groove and the active surface of the chip, the third sub-shielding layer on the inactive surface of the chip, and the second sub-shielding layer between the side surface of the chip and a side surface of the groove and connecting the first sub-shielding layer with the third sub-shielding layer, wherein the first sub-shielding layer has a plurality of openings corresponding to the plurality of chip pads, respectively.

In an example embodiment, the substrate may include a plurality of through holes corresponding to the plurality of openings, respectively, and the semiconductor package may further include a plurality of conductive connectors within the plurality of through holes, respectively.

In an example embodiment, the semiconductor package may further include conductive bumps between the chip pads and the conductive connectors, and the chip pads may be electrically connected to the conductive connectors through the conductive bumps.

In an example embodiment, the conductive bumps and the conductive connectors may not overlap the first sub-shielding layer in a plan view.

In an example embodiment, at least one of the conductive bumps and the conductive connectors may have a same shape as the openings of the first sub-shielding layer in a plan view.

In an example embodiment, each of the conductive bumps may include a lower conductive bump and an upper conductive bump overlapping each other, the lower conductive bump may contact a corresponding one of the conductive connectors, and the upper conductive bump may contact a corresponding one of the chip pads.

In an example embodiment, the semiconductor package may further include a protective layer between the active surface of the chip and the first sub-shielding layer and between the side surface of the chip and the second sub-shielding layer.

In an example embodiment, the semiconductor package may further include a redistribution layer on the second surface of the substrate and electrically connected to the conductive connectors.

In an example embodiment, the semiconductor package may further include a solder resist layer on the second surface of the substrate and partially covering the redistribution layer, and the solder resist layer may have an opening exposing a portion of the redistribution layer.

In an example embodiment, the semiconductor package may further include a solder ball on the solder resist layer and electrically connected to the redistribution layer through the opening of the solder resist layer.

A method of manufacturing a semiconductor package according to an example embodiment may include preparing a substrate including a first surface and a second surface opposite to the first surface, forming a groove recessed from the first surface in the substrate, forming a first preliminary sub-shielding layer and a second sub-shielding layer covering a bottom surface and a side surface of the groove, respectively, the first preliminary sub-shielding layer and the second sub-shielding layer being connected to each other, forming a plurality of openings for exposing the bottom surface of the groove in the first preliminary sub-shielding layer to form a first sub-shielding layer, placing a chip including an active surface, an inactive surface opposite to the active surface, and a side surface connecting the active surface with the inactive surface, in the groove such that the active surface of the chip faces the bottom surface of the groove, and a plurality of chip pads disposed on the active surface of the chip correspond to the plurality of openings, respectively, and forming a third sub-shielding layer connected to the second sub-shielding layer on the inactive surface of the chip.

In an example embodiment, the method may further include forming through holes penetrating the substrate in correspondence with the openings before the placing of the chip, filling the through holes with a conductive material to form conductive connectors, and forming lower conductive bumps within the groove and on the conductive connectors.

In an example embodiment, the chip may further include upper conductive bumps on the chip pads. The placing may include coupling the upper conductive bumps with corresponding ones of the lower conductive bumps, respectively, to form conductive bumps. Both the conductive bumps and the conductive connectors may not overlap the first sub-shielding layer in a plan view.

In an example embodiment, the chip may further include upper conductive bumps on the chip pads. The method may further include forming a preliminary protective layer between the upper conductive bumps and on the side surface of the chip before the placing of the chip. The placing may include coupling the upper conductive bumps with the lower conductive bumps to form conductive bumps, and disposing the preliminary protective layer between the active surface of the chip and the first sub-shielding layer and between the side surface of the chip and the second sub-shielding layer to form a protective layer. The conductive bumps and the conductive connectors may not overlap the first sub-shielding layer in a plan view.

In an example embodiment, the chip may further include upper conductive bumps on the chip pads. The placing may include coupling the upper conductive bumps with the lower conductive bumps to form conductive bumps. The method may further include filling the groove with a protective material to form a protective layer between the active surface of the chip and the first sub-shielding layer and between the side surface of the chip and the second sub-shielding layer. The conductive bumps and the conductive connectors may not overlap the first sub-shielding layer in a plan view.

In an example embodiment, the method may further include providing a redistribution layer electrically connected to the conductive connectors on the second surface of the substrate.

In an example embodiment, the method may further include providing a solder resist layer partially covering the redistribution layer on the second surface of the substrate, and the solder resist layer may have an opening exposing a portion of the redistribution layer.

In an example embodiment, the method may further include providing a solder ball on the solder resist layer, and the solder ball may be electrically connected to the redistribution layer through the opening of the solder resist layer.

According to some example embodiment of the present disclosure, the semiconductor package may have an improved electromagnetic shielding effect. Also, the semiconductor package may have improved reliability. Also, the semiconductor package may be manufactured by a simplified manufacturing process.

BRIEF DESCRIPTION OF THE DRAWINGS

The above and other aspects, features and advantages of the present disclosure will be apparent by describing in detail some example embodiments of the present disclosure hereinafter in combination with the accompanying drawings. In the drawings, like reference numerals will always denote like elements. In the drawings.

DETAILED DESCRIPTION

Figure 1:
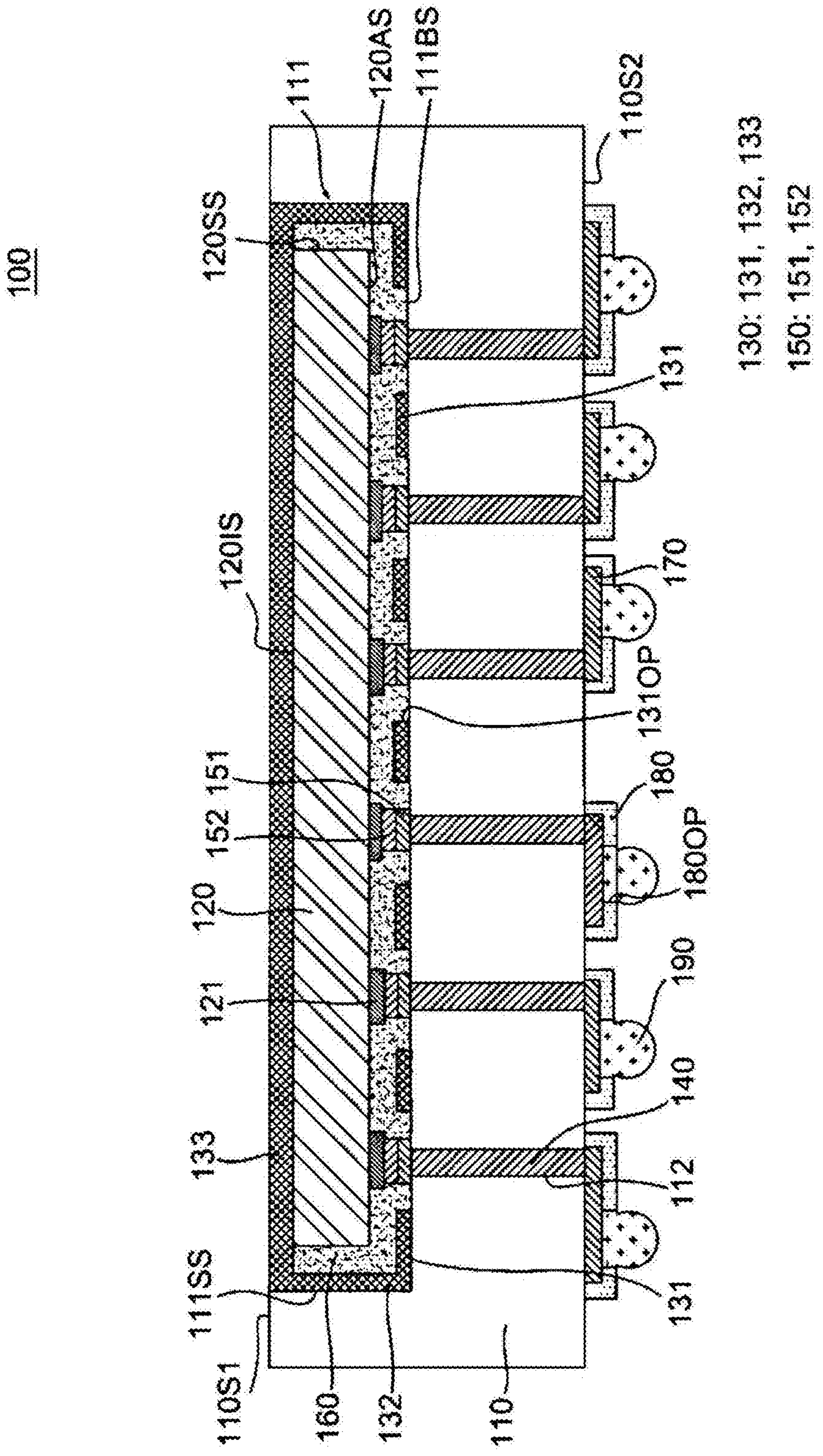
FIG. 1 is a cross-sectional view illustrating a semiconductor package according to an example embodiment of the present disclosure.

Hereinafter, various example embodiments of the present disclosure will be described more fully with reference to the drawings. The present disclosure, however, may be embodied in various different forms, and should not be construed as being limited to the example embodiments set forth herein. Rather, these example embodiments are provided so that the present disclosure will be thorough and complete, and these example embodiments will fully convey the scope of the present disclosure to those skilled in the art. In the drawings, the sizes of layers and regions may be exaggerated for clarity.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" other elements would then be oriented "above" the other elements. Thus, the example terms "below" can encompass both an orientation of "above" and "below". The device may be otherwise oriented (e.g., rotated 90 degrees or at other orientations) and the spatially relative descriptors used herein should be interpreted accordingly.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about"

or "substantially," it will be understood that these values and shapes should be construed as including a manufacturing or operational tolerance (e.g., ±10%) around the stated numerical values or shapes.

Figure 2:
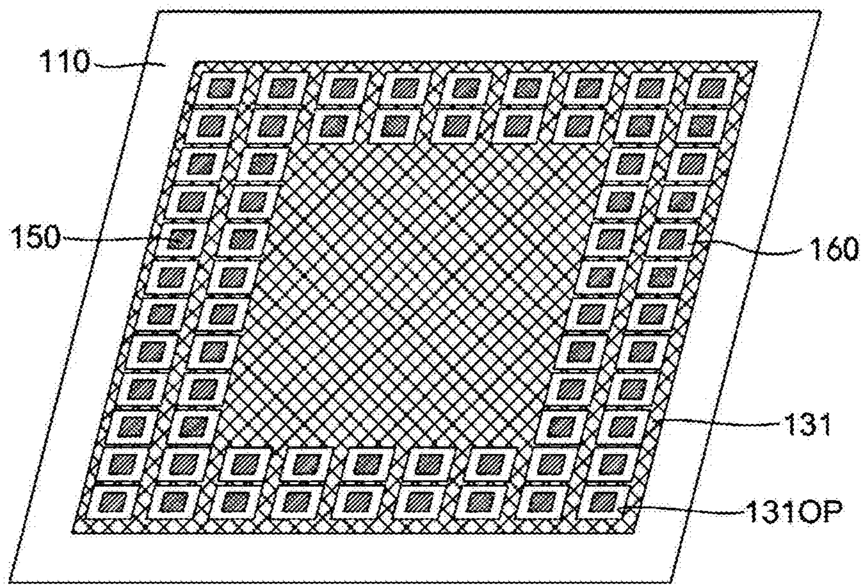
FIG. 2 is a schematic perspective view illustrating a portion of a semiconductor package according to an example embodiment of the present disclosure.

FIG. 1 is a cross-sectional view illustrating a semiconductor package according to an example embodiment of the present disclosure. FIG. 2 is a schematic perspective view illustrating a portion of a semiconductor package according to an example embodiment of the present disclosure. FIG. 2 may be a perspective view showing a cutting surface obtained by cutting a semiconductor package horizontally along a bottom surface of a groove.

Referring to FIGS. 1 and 2, a semiconductor package 100 according to an example embodiment includes a substrate 110, a chip 120, and a shielding layer 130.

The substrate 110 may be any substrate commonly used in the art for manufacturing a semiconductor package. In an example embodiment, the substrate 110 may be formed of an insulating material such as quartz, glass, silicon nitride, silicon oxynitride, and organic resin. In an example embodiment, the substrate 110 may be formed of a semiconductor material. For example, the substrate 110 may be a silicon substrate or may include other materials such as silicon germanium, silicon germanium on insulator (SGOI), indium antimonide, lead telluride, indium arsenide, indium phosphide, gallium arsenide, or gallium antimonide. In an example embodiment, the substrate 110 may be formed of a conductive material. When the substrate 110 is formed of a conductive material or a semiconductor material, an insulating layer such as a silicon oxide layer, a silicon nitride layer, or a silicon oxynitride layer may further be formed on an inner surface (e.g., a side surface and a bottom surface of a groove to be described later and an inner surface of through holes to be described later) and a portion of an outer surface (e.g., a lower surface or a bottom surface) of the substrate 110.

The substrate 110 may include a first surface (e.g., an upper surface or a top surface) 110S1 and a second surface (e.g., a lower surface or a bottom surface) 110S2 opposite to the first surface 110S1. A groove 111 is provided at the first surface 110S1 of the substrate 110, that is, the substrate 110 has a groove 111 recessed (inwardly) from the first surface 110S1. The groove 111 may have a rectangular shape, however, the shape of the groove 111 is not limited thereto. For example, the groove may have a cylindrical shape or a shape of frustum of a cone. The depth of the groove 111 is not particularly limited as long as the depth of the groove 111 matches the thickness of the chip 120.

The chip 120 is disposed in the groove 111. The chip 120 may be a logic chip, a memory chip, an analog chip, or a combination thereof, or the like. The chip 120 may include an active surface 120AS, an inactive surface 120IS opposite to the active surface 120AS, and a side surface 120SS connecting the active surface 120AS with the inactive surface 120IS. The active surface 120AS of the chip 120 may face a bottom surface 111BS of the groove 111, and the inactive surface 120IS of the chip 120 may face an open side of the groove 111.

A plurality of chip pads 121 are disposed on the active surface 120AS of the chip 120. The chip pads 121 may be formed of or include a conductive material such as a metal (e.g., copper (Cu)). In some example embodiments, the chip pads 121 may be disposed in an edge region of the active surface 120AS of the chip 120. In other example embodiments, at least one chip pad 121 may be disposed in a central region of the active surface 120AS of the chip 120, in addition to the chip pads 121 disposed in the edge region of the active surface 120AS of the chip 120. In still other example embodiments, the chip pads 121 may be disposed in substantially the entire region of the active surface 120AS of the chip 120.

The shielding layer 130 is disposed on a side surface 111SS and the bottom surface 111BS of the groove 111 and the inactive surface 120IS of the chip 120. For example, the shielding layer 130 may include a first sub-shielding layer 131 disposed between the bottom surface 111BS of the groove 111 and the active surface 120AS of the chip 120, a third sub-shielding layer 133 disposed on the inactive surface 120IS of the chip 120, and a second sub-shielding layer 132 disposed between the side surface 120SS of the chip 120 and the side surface 111SS of the groove 111 and connecting the first sub-shielding layer 131 with the third sub-shielding layer 133. The first sub-shielding layer 131 and the second sub-shielding layer 132 may be formed at the same time in the same process, or may be formed separately by the same process, or may be formed separately by different processes. The first sub-shielding layer 131, the second sub-shielding layer 132, and the third sub-shielding layer 133 are electrically connected to each other to constitute the shielding layer 130. Two or all of the first sub-shielding layer 131, the second sub-shielding layer 132, and the third sub-shielding layer 133 may be formed integrally.

The first sub-shielding layer 131, the second sub-shielding layer 132, and the third sub-shielding layer 133 may include the same material, or may include different materials. The materials of the first sub-shielding layer 131, the second sub-shielding layer 132, and the third sub-shielding layer 133 are not particularly limited, and may include any material having an electromagnetic shielding property. For example, the first sub-shielding layer 131, the second sub-shielding layer 132, and the third sub-shielding layer 133 may include a metal material such as copper, aluminum, iron, silver, nickel, lead, manganese, or an alloy thereof. For example, the first sub-shielding layer 131, the second sub-shielding layer 132, and the third sub-shielding layer 133 may include a composite material having an electromagnetic shielding property, for example, a composite material containing a substance having an electromagnetic shielding property such as graphene, carbon nanotubes, fullerenes, or MXene.

An upper surface of the third sub-shielding layer 133 may be coplanar with the first surface 110S1 of the substrate 110. However, the present disclosure is not limited thereto. The upper surface of the third sub-shielding layer 133 may be lower or higher than the first surface 110S1 of the substrate 110.

The thicknesses of the first sub-shielding layer 131, the second sub-shielding layer 132, and the third sub-shielding layer 133 are not particularly limited, and may be variously determined according to the intensity of an electromagnetic signal and/or a desired electromagnetic shielding effect. For example, the thickness of each of the first sub-shielding layer 131, the second sub-shielding layer 132, and the third sub-shielding layer 133 may range from about 5 μm to about 20 μm.

The first sub-shielding layer 131 has a plurality of openings 131OP that are disposed in correspondence with the plurality of chip pads 121, respectively. For example, each of the plurality of openings 131OP penetrates the first sub-shielding layer 131. In some example embodiments, the openings 131OP may be disposed in an edge region of the first sub-shielding layer 131. In other example embodiments, at least one opening 131OP may be disposed in a central region of the first sub-shielding layer 131, in addition to the openings 131OP disposed in the edge region of the first sub-shielding layer 131. In still other example embodiments, the openings 131OP may be disposed in substantially the entire region of the first sub-shielding layer 131. The shape of each of the openings 131OP is not particularly limited. For example, the opening 131OP may have a circular shape, a elliptical shape, or a quadrilateral (such as rectangle, square, and rhombus) shape in a plan view.

The plurality of chip pads 121 are disposed in correspondence with a plurality of openings 131OP of the first sub-shielding layer 131, respectively. The chip pads 121 may be electrically connected to the conductive connectors 140 to be described later via the openings 131OP.

The substrate 110 may further include a plurality of through holes 112 corresponding to the plurality of openings 131OP of the first sub-shielding layer 131, respectively. Each of the through holes 112 may penetrate the substrate 110, that is, may extend from the second surface 110S2 of the substrate 110 to the bottom surface 111BS of the groove 111. The size (e.g., width or diameter) of the through hole 112 in a horizontal direction may be smaller than the size (e.g., width or diameter) of the opening 131OP in the horizontal direction. For example, the through hole 112 may have a shape the same as the shape of the opening 131OP, and a size (e.g., width or diameter) smaller than the size (e.g., width or diameter) of the opening 131OP in a plan view.

A plurality of conductive connectors 140 may be disposed (e.g., filled) within the plurality of through holes 112, respectively. The conductive connector 140 may include a conductive material such as Cu, W, Al, Au, Ag, Ni, Ta, Ti, TaN, TiN, or a combination thereof.

A plurality of conductive bumps 150 may be disposed on the plurality of conductive connectors 140, respectively. For example, the conductive bump 150 may be disposed between a corresponding one of the conductive connectors 140 and a corresponding one of the chip pads 121. The conductive bump 150 may include a material the same as or different from that of the conductive connector 140. Each of the chip pads 121 is electrically connected to a corresponding one of the conductive connectors 140 through a corresponding one of the conductive bumps 150.

In a plan view, the conductive connector 140 and the conductive bump 150 may be located inside a corresponding one of the openings 131OP of the first sub-shielding layer 131 and spaced apart from an edge of the opening 131OP. In other words, the conductive connectors 140 and the conductive bumps 150 may not overlap the first sub-shielding layer 131 in a plan view.

For example, similarly to the through hole 112 in which the conductive connector 140 is formed, the conductive bump 150 may have the same shape as that of the opening 131OP, and a size (e.g., width or diameter) smaller than the size (e.g., width or diameter) of the opening 131OP in a plan view. In an example embodiment, the size (e.g., width or diameter) of each of the opening 131OP may range, for example, from about 100 μm to about 200 μm, the size (e.g., width or diameter) of each of the conductive bumps 150 may range, for example, from about 30 μm to about 150 μm, and the size (e.g., width or diameter) of each of the through holes 112 may range, for example, from about 10 μm to about 60 μm.

Each of the conductive bumps 150 may have an integral (or unitary) structure. In some example embodiments, each of the conductive bumps 150 may include a lower conductive bump 151 (see FIGS. 1 and 8) formed on the conductive connector 140 and contacting the conductive connector 140 and an upper conductive bump 152 (see FIGS. 1 and 9) formed on the chip pad 121 and contacting the chip pad 121. The lower conductive bump 151 and the upper conductive bump 152 are coupled with each other and electrically connected to each other to form the conductive bump 150.

The semiconductor package 100 according to an example embodiment may further include a protective layer 160. The protective layer 160 is disposed between the active surface 120AS of the chip 120 and the first sub-shielding layer 131 and between the side surface 120SS of the chip 120 and the second sub-shielding layer 132. The protective layer 160 may further be disposed between the active surface 120AS of the chip 120 and a portion of the bottom surface 111BS of the groove 111 that is not covered by the first sub-shielding layer 131. The protective layer 160 is provided to protect the chip 120, the first sub-shielding layer 131, the second sub-shielding layer 132, the chip pads 121, and the conductive bumps 150. As shown in FIG. 1, a top surface of the protective layer 160 is coplanar with the inactive surface 120IS of the chip 120, but the present disclosure is not limited thereto. The top surface of the protective layer 160 may be higher or lower than the inactive surface 120IS of the chip 120. The protective layer 160 may include an insulating material such as a non-conductive film (NCF), a non-conductive paste (NCP), or a capillary underfill (CUF) material.

A redistribution layer 170 may be disposed on the second surface 110S2 of the substrate 110 to be electrically connected (e.g., directly electrically connected) to the conductive connectors 140. An example embodiment in which the redistribution layer 170 includes a single conductive layer is schematically shown in FIG. 1, but the present disclosure is not limited thereto. For example, the redistribution layer 170 may include a plurality of conductive layers and a plurality of insulating layers stacked on each other, and the plurality of conductive layers may be connected to each other through conductive via structures penetrating through the insulating layers. The conductive layer may be formed of or include at least one of conductive materials, for example, the conductive layer may be formed of or include copper (Cu).

A solder resist layer 180 may be disposed on the second surface 110S2 of the substrate 110 and partially cover the redistribution layer 170. The solder resist layer 180 may be formed of a solder resist material. The solder resist layer 180 may have an opening 180OP that exposes a portion of the redistribution layer 170.

Solder balls 190 may be formed on the solder resist layer 180 and electrically connected to the redistribution layer 170 through the openings 180OP of the solder resist layer 180. The solder balls 190 may be disposed directly on the redistribution layer 170 and optionally include a portion disposed on the solder resist layer 180. The solder balls 190 may be used as connection terminals for connecting the semiconductor package 100 to an external device. For example, an electrical signal may be transmitted from the chip 120 to the external device through the chip pad 121, the conductive bump 150, the conductive connector 140, the redistribution layer 170 and the solder ball 190, or an electrical signal may be transmitted from the external device to the chip 120 through the solder ball 190, the redistribution layer 170, the conductive connector 140, the conductive bump 150 and the chip pad 121.

The semiconductor package 100 according to an example embodiment of the present disclosure includes the groove 111 formed in the substrate 110, in which the chip 120 is disposed, and the first sub-shielding layer 131, the second sub-shielding layer 132, and the third sub-shielding layer

133 electrically connected to each other are disposed on the bottom surface 111BS and the side surface 111SS of the groove 111 and the inactive surface 120IS of the chip 120, respectively. By such configuration, all surfaces of the chip 120 (e.g., six surfaces including an upper surface, a lower surface, a left surface, a right surface, a front surface, and a rear surface) can be electromagnetically shielded without increasing a volume of the semiconductor package 100. Therefore, the semiconductor package 100 according to an example embodiment of the present disclosure may have an improved electromagnetic shielding effect. In addition, the first sub-shielding layer 131, the second sub-shielding layer 132, and the third sub-shielding layer 133 are connected to each other (e.g., formed integrally), and thus the strength of the shielding layer 130 may be enhanced. Therefore, the semiconductor package 100 including such a shielding layer 130 is not prone to failure, and thus has improved reliability. In addition, the semiconductor package according to an example embodiment of the present disclosure may be manufactured by a simplified manufacturing process which will be described later.

As described above, in an example embodiment in which the substrate 110 is formed of a conductive material or a semiconductor material, the semiconductor package 100 may further include an insulating layer disposed between the substrate 110 and other elements in contact with the substrate 110 (e.g., on the side surface 111SS and the bottom surface 111BS of the groove 111, on the inner surface of the through hole 112, and on the second surface 110S2 of the substrate 110).

Figure 3:
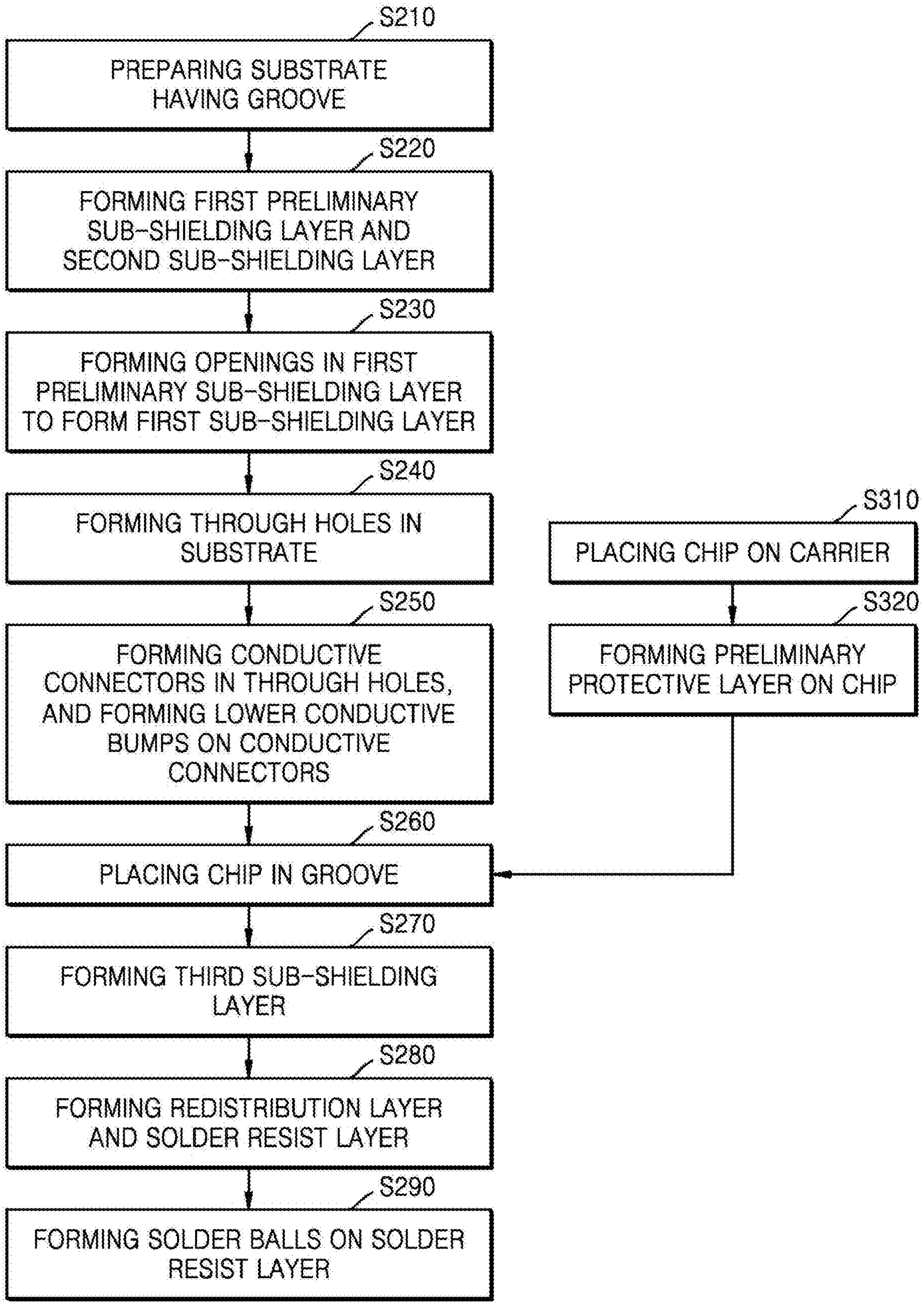
FIG. 3 is a flowchart illustrating a method of manufacturing a semiconductor package according to an example embodiment of the present disclosure.

FIG. 3 is a flowchart illustrating a method of manufacturing a semiconductor package according to an example embodiment of the present disclosure. FIGS. 4 to 13 are cross-sectional views illustrating steps of a method of manufacturing a semiconductor package according to an example embodiment of the present disclosure.

A method of manufacturing a semiconductor package according to an example embodiment of the present disclosure will be described below with reference to FIGS. 3 to 13. In FIGS. 3 to 13, reference numerals identical to those in FIGS. 1 and 2 are used to denote identical elements, and therefore, redundant descriptions will be omitted.

Figure 4:
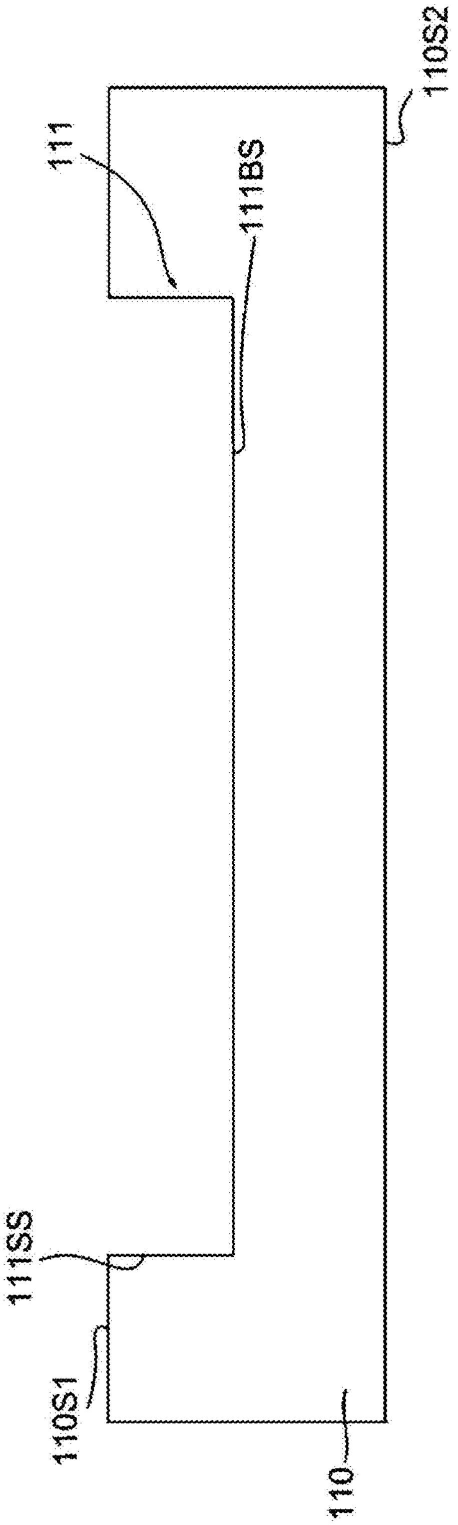
FIGS. 4 to 13 are cross-sectional views illustrating steps of a method of manufacturing a semiconductor package according to an example embodiment of the present disclosure.

Referring to FIGS. 3 and 4, in step S210, first, a substrate 110 including a first surface 110S1 and a second surface 110S2 opposite to the first surface 110S1 may be prepared. Then, a groove 111 may be formed inwardly from the first surface 110S1 of the substrate 110. The groove 111 may be recessed from the first surface 110S1 toward the inside of the substrate 110. The groove 111 may be formed by a process such as wet etching, plasma etching, laser etching, or the like. The groove 111 may have a bottom surface 111BS substantially parallel to the first surface 110S1, and a side surface 111SS connecting the first surface 110S1 with the bottom surface 111BS and substantially perpendicular to the first surface 110S1 and the bottom surface 111BS.

Figure 5:
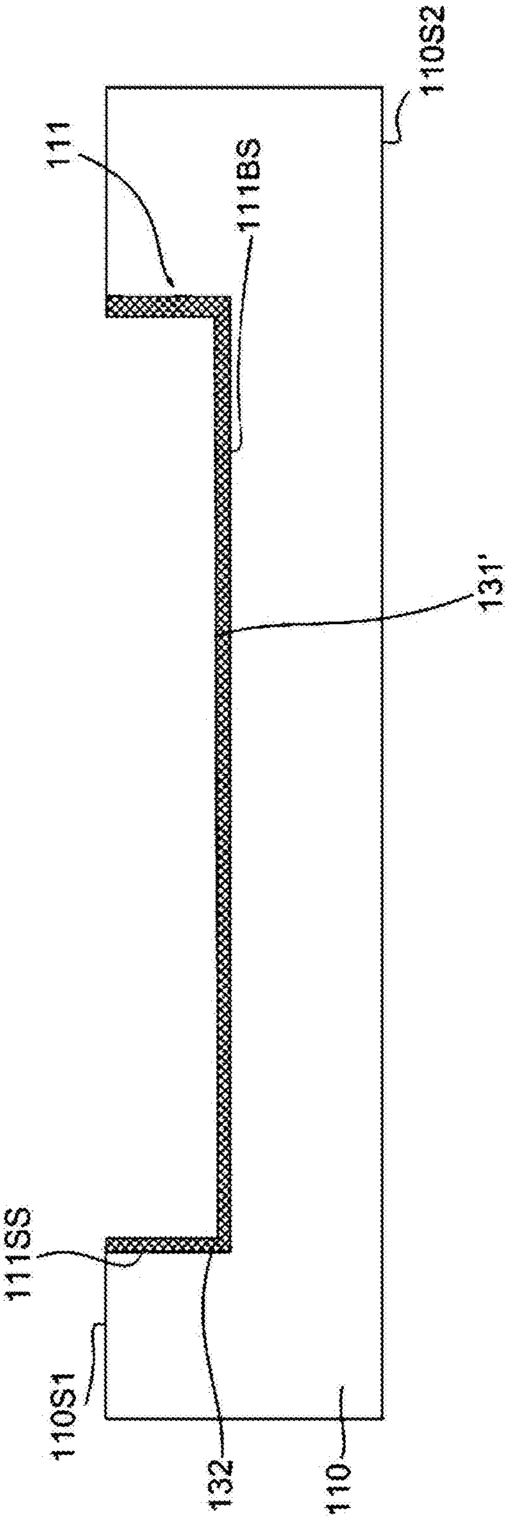

Referring to FIGS. 3 and 5, in step S220, a first preliminary sub-shielding layer 131' and a second sub-shielding layer 132 covering the bottom surface 111BS and the side surface 111SS of the groove 111, respectively, may be formed. For example, the first preliminary sub-shielding layer 131' and the second sub-shielding layer 132 may be formed by a process such as sputtering, evaporation, or printing. The first preliminary sub-shielding layer 131' and the second sub-shielding layer 132 may be formed at the same time by the same process, or may be formed separately by the same process, or may be formed separately by different processes.

Figure 6:
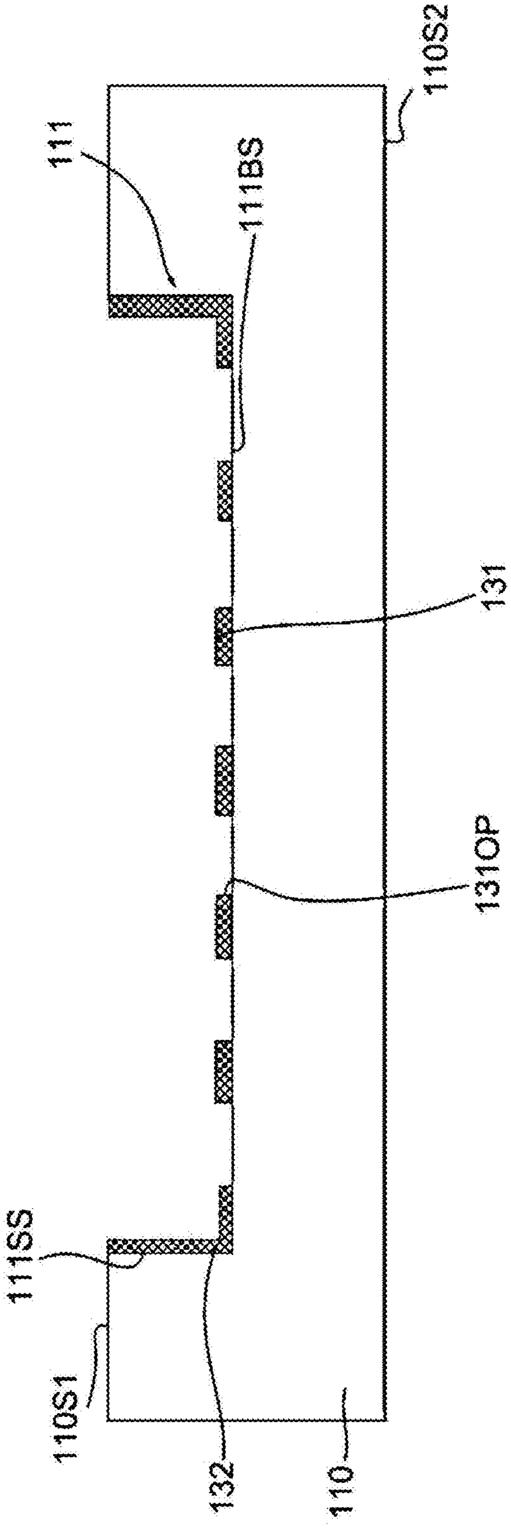

Referring to FIGS. 3 and 6, in step S230, a plurality of openings 131OP may be formed in the first preliminary sub-shielding layer 131' to form a first sub-shielding layer 131. For example, the first sub-shielding layer 131 may be formed by forming the plurality of openings 131OP in the first preliminary sub-shielding layer 131' through an etching process using a mask.

Figure 7:
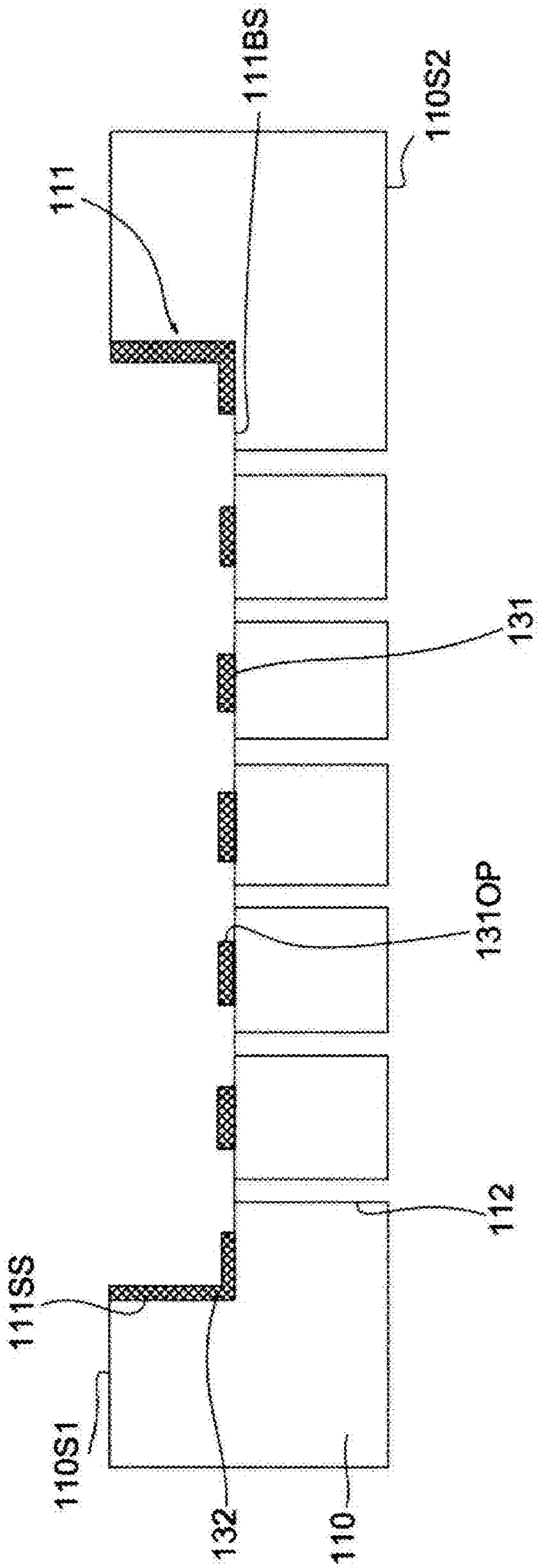

Referring to FIGS. 3 and 7, in step S240, a plurality of through holes 112 penetrating the substrate 110 may be formed (e.g., at the second surface 110S2 of the substrate 110) to correspond to the plurality of openings 131OP, respectively. For example, the through holes 112 may be formed by a TGV (Through Glass Via) process using dry etching and/or laser.

Figure 8:
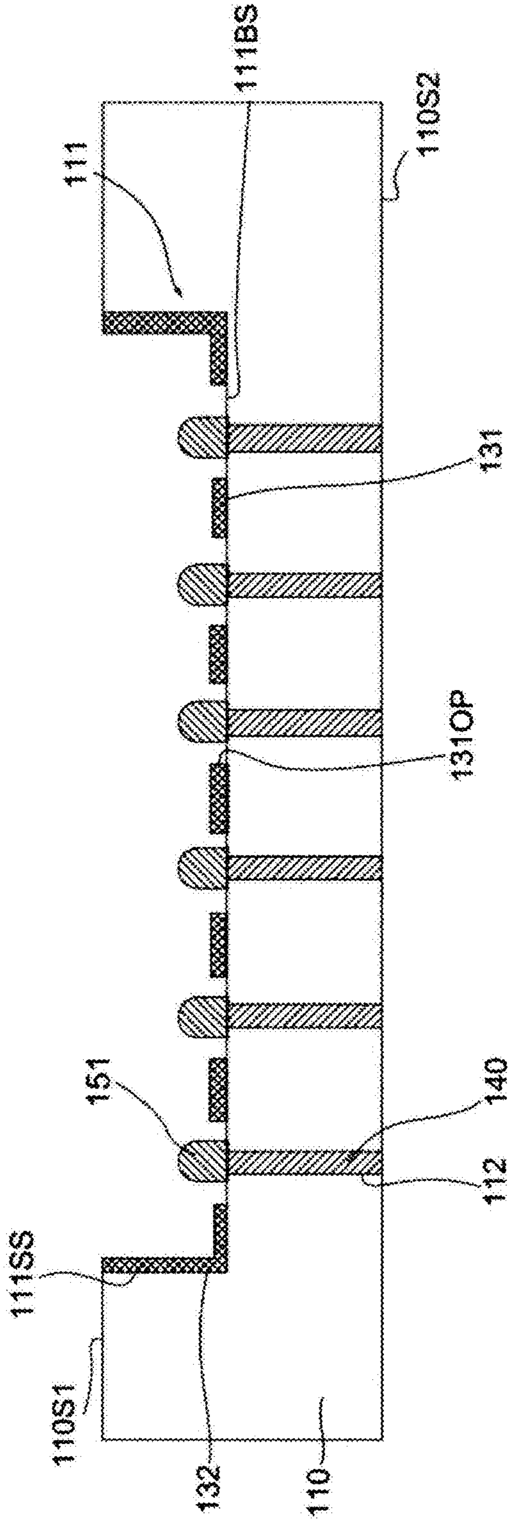

Referring to FIGS. 3 and 8, in step S250, the through holes 112 may be filled with a conductive material to form conductive connectors 140, and lower conductive bumps 151 may be formed on the conductive connectors 140. For example, the conductive connectors 140 may be formed by a process such as electroplating. For example, the lower conductive bumps 151 may be formed by a reflow process.

Figure 9:
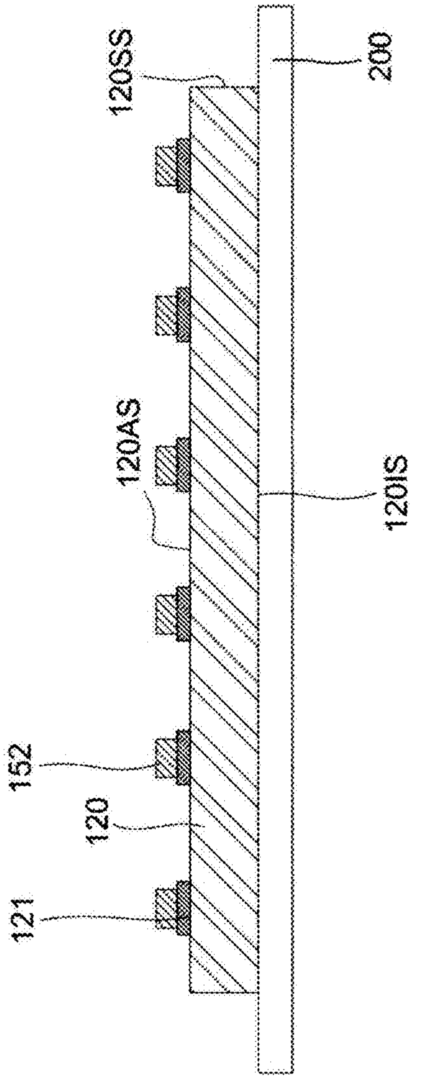

Referring to FIGS. 3 and 9, in step S310, a chip 120 may be placed on a carrier 200. The chip 120 may include an active surface 120AS, an inactive surface 120IS opposite to the active surface 120AS, and a side surface 120SS connecting the active surface 120AS with the inactive surface 120IS. The active surface 120AS of the chip 120 is provided with a plurality of chip pads 121, and an upper conductive bump 152 is disposed on each of the chip pads 121. For example, the upper conductive bumps 152 may be formed on the chip pads 121 in advance by a bumping process.

Figure 10:
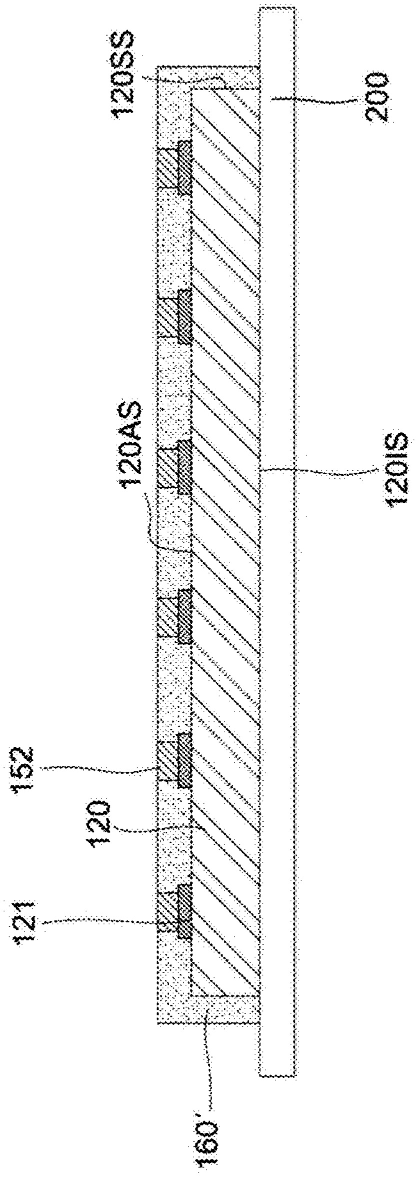

Referring to FIGS. 3 and 10, in step S320, a preliminary protective layer 160' may be formed between the upper conductive bumps 152 and on the side surface 120SS of the chip 120. In other words, the preliminary protective layer 160' may be formed along side surfaces of the upper conductive bumps 152, the active surface 120AS of the chip 120, and the side surface 120SS of the chip 120. For example, the preliminary protective layer 160' may be formed by coating a non-conductive film (NCF), a non-conductive paste (NCP), or a capillary underfill (CUF) material. A top surface of the preliminary protective layer 160' may be coplanar with top surfaces of the upper conductive bumps 152.

Figure 11:
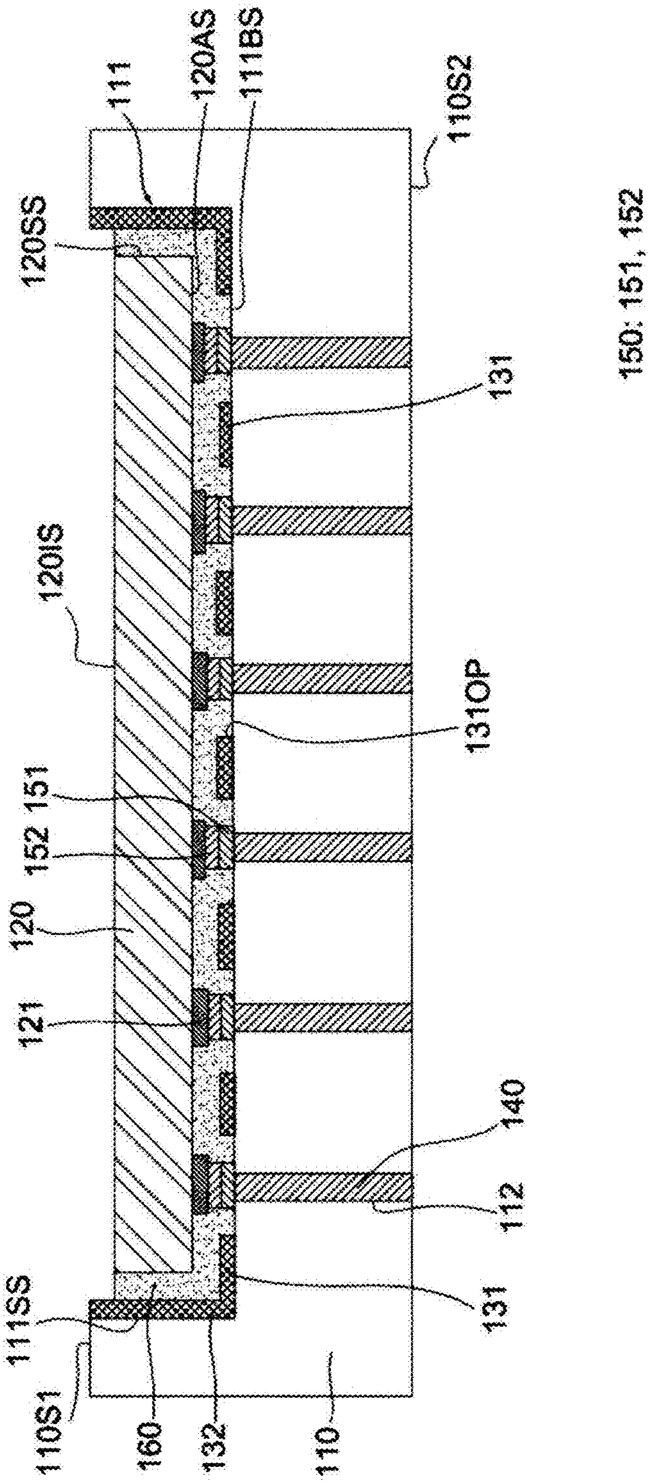

Referring to FIGS. 3 and 11, in step S260, the chip 120 may be removed from the carrier 200, and placed in the groove 111. For example, the chip 120 may be placed such that the active surface 120AS of the chip 120 faces the bottom surface 111BS of the groove 111. For example, the upper conductive bumps 152 on the chip 120 and the lower conductive bumps 151 on the conductive connectors 140 may be coupled to each other by hot press welding or the like to form the conductive bumps 150. The preliminary protective layer 160' may be disposed between the side surface 120SS of the chip 120 and the second sub-shielding layer 132 and between the active surface 120AS of the chip 120 and the first sub-shielding layer 131 to form a protective layer 160. The protective layer 160 may also be located between the active surface 120AS of the chip 120 and a portion of the bottom surface 111BS of the groove 111 that is not covered by the first sub-shielding layer 131. In addition, the protective layer 160 may surround the conductive bumps 150 and the chip pads 121.

Figure 12:
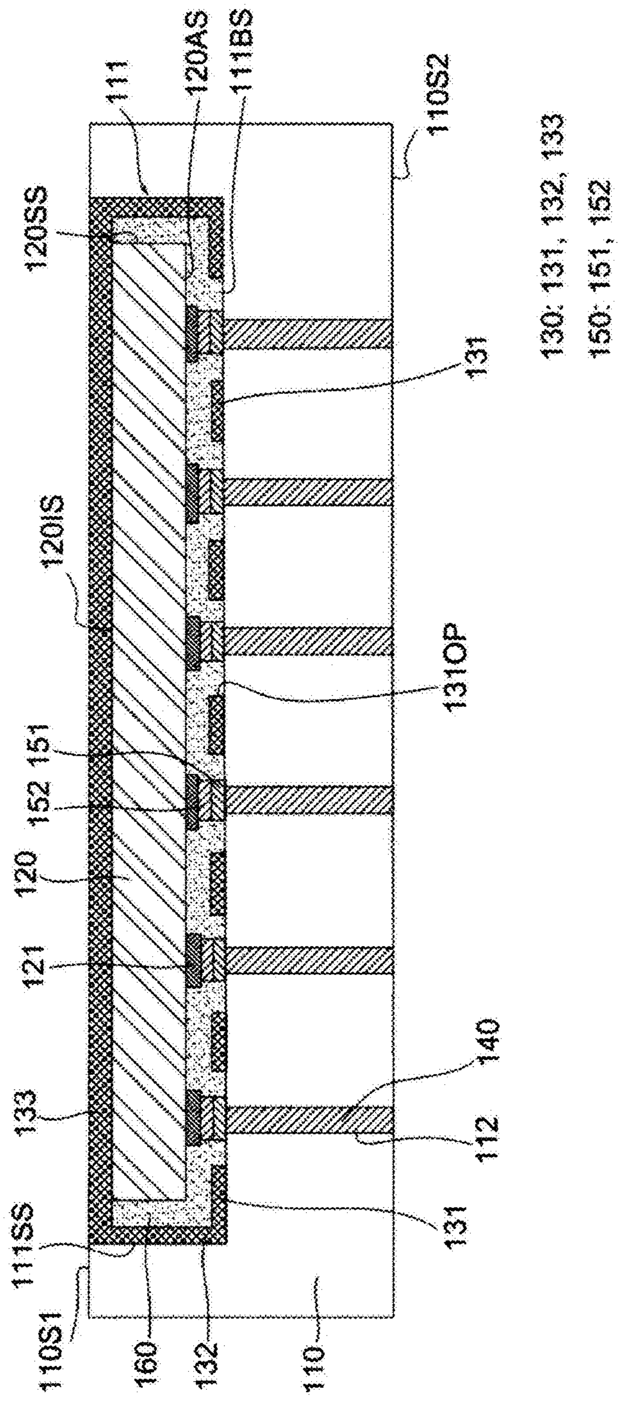

Referring to FIGS. 3 and 12, in step S270, a third sub-shielding layer 133 may be formed on the inactive surface 120IS of the chip 120 such that the third sub-shielding layer 133 is electrically connected to (e.g., contact)

the second sub-shielding layer 132. For example, the third sub-shielding layer 133 may be formed by a process such as sputtering, evaporation, or printing. Therefore, the first sub-shielding layer 131, the second sub-shielding layer 132 and the third sub-shielding layer 133 may be electrically connected to each other (e.g., formed integrally) to constitute the shielding layer 130.

Figure 13:
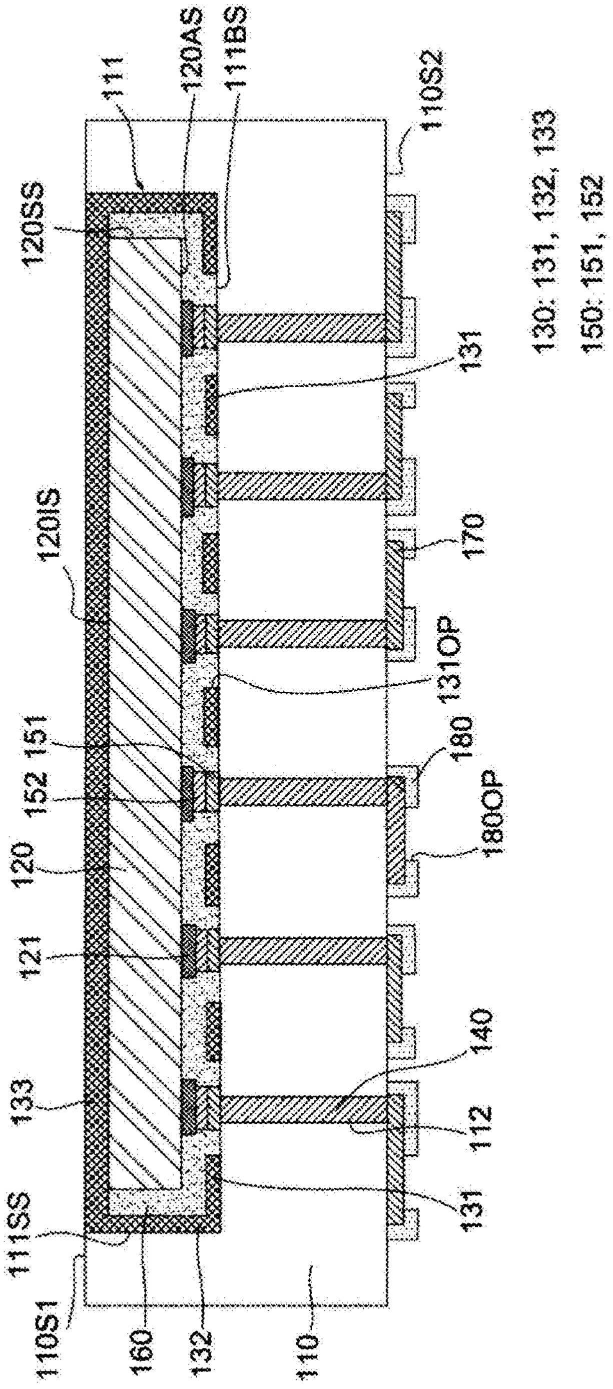

Referring to FIGS. 3 and 13, in step S280, a redistribution layer 170 and a solder resist layer 180 may be formed on the second surface 110S2 of the substrate 110. The redistribution layer 170 may be electrically connected to the conductive connectors 140. For example, the redistribution layer 170 electrically connected to the conductive connectors 140 may be formed by depositing a metal layer on the second surface 110S2 of the substrate 110. For example, the redistribution layer 170 may be formed by alternately depositing a metal layer and an insulating layer on the second surface 110S2 of the substrate 110. The solder resist layer 180 having openings 180OP may be formed by forming a solder resist layer covering the redistribution layer 170 on the second surface 110S2 of the substrate 110 and then performing an etching process on the solder resist layer.

Referring to FIGS. 3 and 1, in step S290, solder balls 190 may be formed on the solder resist layer 180 such that the solder balls 190 are electrically connected to (e.g., contact) the redistribution layer 170 through the openings 180OP of the solder resist layer 180. For example, the solder balls 190 may be formed on the solder resist layer 180 by a BGA packaging technology.

Through the above steps, the semiconductor package 100 according to an example embodiment of the present disclosure may be manufactured.

Figure 14:
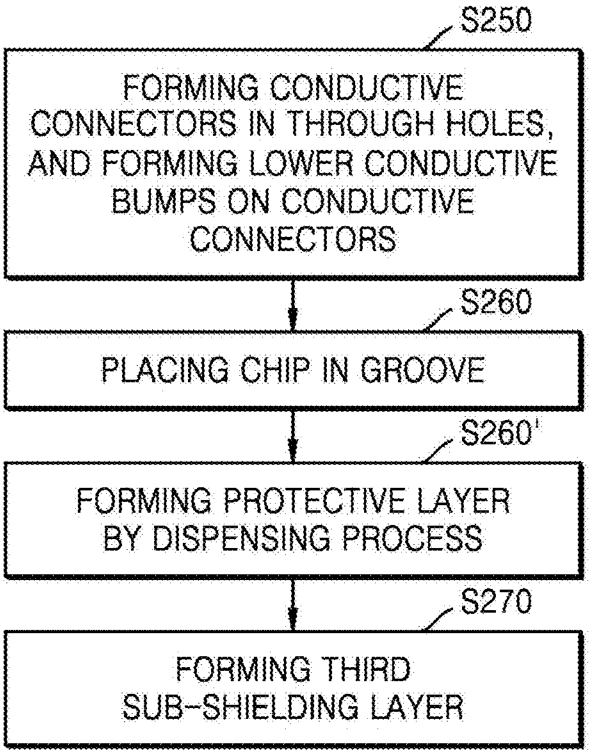
FIG. 14 is a flowchart illustrating a part of steps of a method of manufacturing a semiconductor package according to another example embodiment of the present disclosure.
Figure 15:
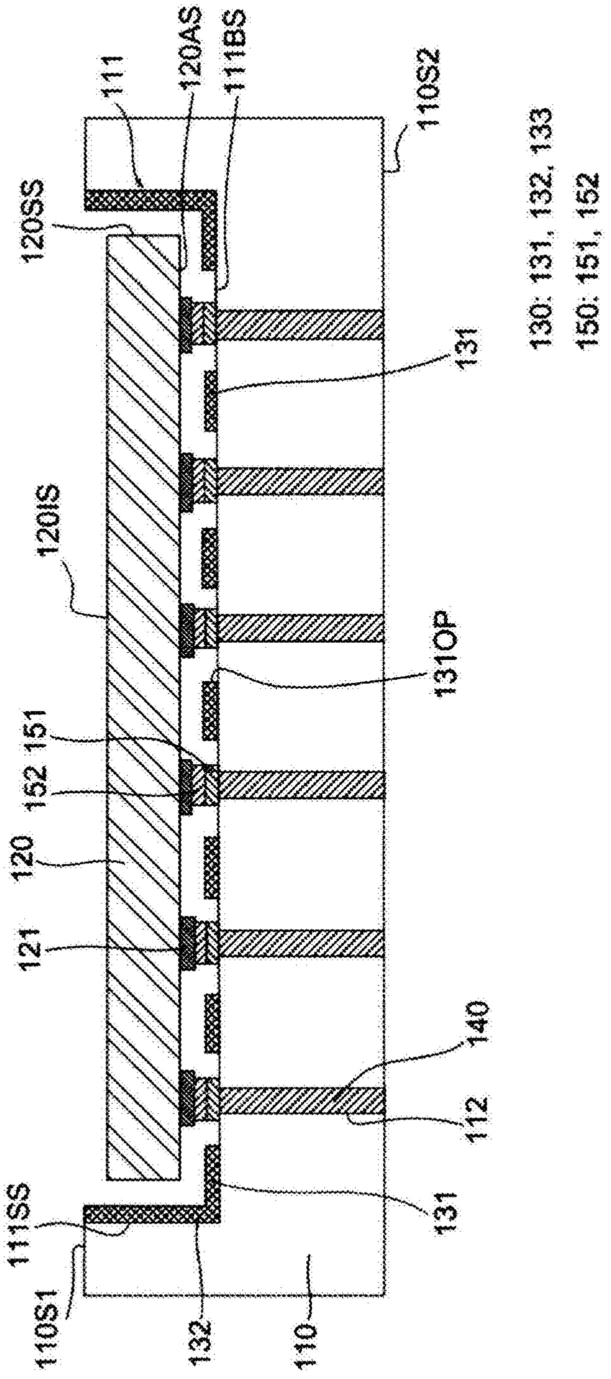
FIG. 15 is a cross-sectional view illustrating an intermediate step of a method of manufacturing a semiconductor package according to another example embodiment of the present disclosure.

FIG. 14 is a flowchart illustrating a part of steps of a method of manufacturing a semiconductor package according to another example embodiment of the present disclosure. FIG. 15 is a cross-sectional view illustrating an intermediate step of a method of manufacturing a semiconductor package according to another example embodiment of the present disclosure. The method of manufacturing the semiconductor package of FIGS. 14 and 15 differs from the method of manufacturing the semiconductor package of FIGS. 3 to 13 in that, the preliminary protective layer 160' is not formed on the active surface 120AS and the side surface 120SS of the chip 120 in advance, and therefore the carrier 200 for carrying the chip 120 may not be needed.

Referring to FIGS. 14 and 15, after step S250 described with reference to FIG. 8, the chip 120 may be placed directly within the groove 111 of the substrate 110 (S260). For example, the chip 120 may be placed such that the active surface 120AS of the chip 120 faces the bottom surface 111BS of the groove 111. For example, the upper conductive bumps 152 on the chip 120 and the lower conductive bumps 151 on the conductive connectors 140 may be coupled to each other by hot press welding or the like to form the conductive bumps 150.

Subsequently, in step S260', a protective material may be filled (e.g., charged) between the chip 120 and the first and second sub-shielding layers 131 and 132 (or in a gap between the chip 120 and the side surface 111SS and the bottom surface 111BS of the groove 111) by a dispensing process to form the protective layer 160. The protective layer 160 may be located between the side surface 120SS of the chip 120 and the second sub-shielding layer 132 and between the active surface 120AS of the chip 120 and the first sub-shielding layer 131. The protective layer 160 may also be located between the active surface 120AS of the chip 120 and a portion of the bottom surface 111BS of the groove 111 that is not covered by the first sub-shielding layer 131. In addition, the protective layer 160 may surround the conductive bumps 150 and the chip pads 121.

Next, step S270 described with reference to FIG. 12 may be performed to form the third sub-shielding layer 133 on the inactive surface 120IS of the chip 120.

According to the method of manufacturing the semiconductor package 100 in accordance with an example embodiment of the present disclosure, the groove 111 for accommodating the chip 120 is formed in the substrate 110, and the first sub-shielding layer 131, the second sub-shielding layer 132 and the third sub-shielding layer 133 are formed on the bottom surface 111BS and the side surface 111SS of the groove 111 and the inactive surface 120IS of the chip, respectively. Therefore, all surfaces of the chip 120 (e.g., six surfaces including an upper surface, a lower surface, a left surface, a right surface, a front surface, and a rear surface) can be electromagnetically shielded without increasing a volume of the semiconductor package 100. Therefore, the semiconductor package 100 according to an example embodiment of the present disclosure can have an improved electromagnetic shielding effect. In addition, there is no need to provide a separate shielding case (or cover) compared with a typical semiconductor package in which a shielding case (or cover) is provided, and thus the manufacturing process can be simplified. In addition, the first sub-shielding layer 131, the second sub-shielding layer 132 and the third sub-shielding layer 133 are connected to each other (e.g., formed integrally), and thus the strength of the shielding layer 130 may be enhanced. Therefore, the semiconductor package 100 including such a shielding layer 130 is not prone to failure, and thus has improved reliability.

Although the present disclosure has been specifically shown and described with reference to some example embodiments thereof, it will be understood that various changes in form and detail may be made therein without departing from the spirit and scope of the appended claims.

What is claimed is:

1. A semiconductor package, comprising:

a substrate comprising a first surface and a second surface opposite to the first surface, the substrate having a groove recessed from the first surface;

a chip within the groove, the chip comprising an active surface facing a bottom surface of the groove, an inactive surface opposite to the active surface, and a side surface connecting the active surface with the inactive surface, a plurality of chip pads on the active surface of the chip; and a shielding layer comprising a first sub-shielding layer, a second sub-shielding layer, and a third sub-shielding layer, the first sub-shielding layer between the bottom surface of the groove and the active surface of the chip, the third sub-shielding layer on the inactive surface of the chip, and the second sub-shielding layer between the side surface of the chip and a side surface of the groove and connecting the first sub-shielding layer with the third sub-shielding layer, wherein the first sub-shielding layer has a plurality of openings corresponding to the plurality of chip pads, respectively.

2. The semiconductor package of claim 1, wherein the substrate comprises a plurality of through holes corresponding to the plurality of openings, respectively, and the semiconductor package further comprises conductive connectors within the plurality of through holes, respectively.

3. The semiconductor package of claim 2, further comprising:
conductive bumps between the chip pads and the conductive connectors,
wherein the chip pads are electrically connected to the conductive connectors through the conductive bumps.

4. The semiconductor package of claim 3, wherein the conductive bumps and the conductive connectors do not overlap the first sub-shielding layer in a plan view.

5. The semiconductor package of claim 4, wherein at least one of the conductive bumps and the conductive connectors has a same shape as the openings of the first sub-shielding layer in a plan view.

6. The semiconductor package of claim 3, wherein each of the conductive bumps comprises a lower conductive bump and an upper conductive bump overlapping each other, the lower conductive bump contacting a corresponding one of the conductive connectors, and the upper conductive bump contacting a corresponding one of the chip pads.

7. The semiconductor package of claim 1, further comprising:
a protective layer between the active surface of the chip and the first sub-shielding layer and between the side surface of the chip and the second sub-shielding layer.

8. The semiconductor package of claim 2, further comprising:
a redistribution layer on the second surface of the substrate and electrically connected to the conductive connectors.

9. The semiconductor package of claim 8, further comprising:
a solder resist layer on the second surface of the substrate and partially covering the redistribution layer, the solder resist layer having an opening exposing a portion of the redistribution layer.

10. The semiconductor package of claim 9, further comprising:
a solder ball on the solder resist layer and electrically connected to the redistribution layer through the opening of the solder resist layer.

11. A method of manufacturing a semiconductor package, comprising:
preparing a substrate comprising a first surface and a second surface opposite to the first surface;
forming a groove recessed from the first surface in the substrate;
forming a first preliminary sub-shielding layer and a second sub-shielding layer covering a bottom surface and a side surface of the groove, respectively, the first preliminary sub-shielding layer and the second sub-shielding layer being connected to each other;
forming a plurality of openings for exposing the bottom surface of the groove in the first preliminary sub-shielding layer to form a first sub-shielding layer;
placing a chip comprising an active surface, an inactive surface opposite to the active surface, and a side surface connecting the active surface with the inactive surface, in the groove such that the active surface of the chip faces the bottom surface of the groove, and a plurality of chip pads disposed on the active surface of the chip correspond to the plurality of openings, respectively; and
forming a third sub-shielding layer connected to the second sub-shielding layer on the inactive surface of the chip.

12. The method of claim 11, further comprising:
forming through holes penetrating the substrate in correspondence with the openings before the placing of the chip;
filling the through holes with a conductive material to form conductive connectors; and
forming lower conductive bumps within the groove and on the conductive connectors.

13. The method of claim 12, wherein
the chip further comprises upper conductive bumps on the chip pads,
the placing comprises coupling the upper conductive bumps with corresponding ones of the lower conductive bumps, respectively, to form conductive bumps, and
both the conductive bumps and the conductive connectors do not overlap the first sub-shielding layer in a plan view.

14. The method of claim 12, wherein
the chip further comprises upper conductive bumps on the chip pads,
the method further comprises forming a preliminary protective layer between the upper conductive bumps and on the side surface of the chip before the placing of the chip,
the placing comprises,
coupling the upper conductive bumps with the lower conductive bumps to form conductive bumps, and
disposing the preliminary protective layer between the active surface of the chip and the first sub-shielding layer and between the side surface of the chip and the second sub-shielding layer to form a protective layer, and
the conductive bumps and the conductive connectors do not overlap the first sub-shielding layer in a plan view.

15. The method of claim 12, wherein
the chip further comprises upper conductive bumps on the chip pads,
the placing comprises coupling the upper conductive bumps with the lower conductive bumps to form conductive bumps,
the method further comprises filling the groove with a protective material to form a protective layer between the active surface of the chip and the first sub-shielding layer and between the side surface of the chip and the second sub-shielding layer, and
the conductive bumps and the conductive connectors do not overlap the first sub-shielding layer in a plan view.

16. The method of claim 12, further comprising:
providing a redistribution layer electrically connected to the conductive connectors on the second surface of the substrate.

17. The method of claim 16, further comprising:
providing a solder resist layer partially covering the redistribution layer on the second surface of the substrate,
wherein the solder resist layer has an opening exposing a portion of the redistribution layer.

18. The method of claim 17, further comprising:
providing a solder ball on the solder resist layer,
wherein the solder ball is electrically connected to the redistribution layer through the opening of the solder resist layer.

* * * * *